(12) United States Patent
Ayukawa et al.

(10) Patent No.: US 6,430,089 B2
(45) Date of Patent: Aug. 6, 2002

(54) SEMICONDUCTOR DEVICE

(75) Inventors: Kazushige Ayukawa, Kokubunji; Takao Watanabe, Fuchu; Yoshinobu Nakagome, Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/740,959

(22) Filed: Dec. 21, 2000

Related U.S. Application Data

(63) Continuation of application No. 09/614,759, filed on Jul. 11, 2000, now Pat. No. 6,195,294, which is a division of application No. 09/158,551, filed on Sep. 22, 1998, now Pat. No. 6,111,793, which is a division of application No. 08/831,743, filed on Apr. 1, 1997, now Pat. No. 5,835,417, which is a continuation of application No. 08/558,778, filed on Nov. 15, 1995, now Pat. No. 5,657,273.

(30) Foreign Application Priority Data

Nov. 22, 1994 (JP) .............................................. 6-287660

(51) Int. Cl.[7] .................................................. G11C 7/00
(52) U.S. Cl. ............................ 365/189.04; 365/230.05; 365/230.09
(58) Field of Search ....................... 365/189.04, 230.05, 365/230.09

(56) References Cited

U.S. PATENT DOCUMENTS

| 4,847,809 A | 7/1989 | Suzuki |
| 4,912,680 A | 3/1990 | Masaki et al. |
| 5,065,363 A | 11/1991 | Sata et al. |
| 5,343,425 A | * 8/1994 | Saito et al. ......... 365/230.09 X |
| 5,377,154 A | * 12/1994 | Takasugi ............... 365/189.01 |
| 5,422,856 A | 6/1995 | Sasaki et al. |
| 5,473,574 A | 12/1995 | Clemen et al. |
| 5,606,525 A | 2/1997 | Fujii |
| 5,640,528 A | * 6/1997 | Harney et al. .............. 395/416 |
| 5,657,273 A | 8/1997 | Ayukawa et al. |
| 5,678,058 A | 10/1997 | Sato |
| 5,680,363 A | 10/1997 | Dosaka et al. |
| 5,687,351 A | * 11/1997 | Toda ..................... 365/230.05 |

FOREIGN PATENT DOCUMENTS

| JP | 3-3195 | 1/1991 |
| JP | 3-91191 | 4/1991 |

OTHER PUBLICATIONS

Y. Aimoto et al, "Memory Array Circuits of Integrated Memory Array Processor (IMAP) LSI", Proceedings of the 1994 IEICE Spring Conference, 5–261, C–693.

* cited by examiner

Primary Examiner—Huan Hoang
(74) Attorney, Agent, or Firm—Mattingly, Stanger & Malur, P.C.

(57) ABSTRACT

A semiconductor device integrated on a chip includes a memory cell array, multiple processing elements and multiple data transfer circuits which transfer data between memory cells and the processing elements over read paths and write paths provided separately. The divide is capable of transferring data from memory cells to the processing elements and from the processing elements to memory cells concurrently over the read paths and write paths, respectively, so that faster image data processing is accomplished, and also capable of processing data on once-activated word lines successively thereby to reduce the number of times of driving of each word line so that the power consumption is reduced.

6 Claims, 7 Drawing Sheets

SEMICONDUCTOR DEVICE

This is a continuation application of U.S. Ser. No. 09/614,759, filed Jul. 11, 2000, now U.S. Pat. No. 6,195, 294; which is a divisional application of U.S. Ser. No. 09/158,551, filed Sep. 22, 1998, now U.S. Pat. No. 6,111, 793; which is a divisional application of U.S. Ser. No. 08/831,743, filed Apr. 1, 1997, now U.S. Pat. No. 5,835,417; which is a continuation application of U.S. Ser. No. 08/558, 778, filed Nov. 15, 1995, now U.S. Pat. No. 5,657,273.

BACKGROUND OF THE INVENTION

The present invention relates to a semiconductor device, and particularly to a semiconductor device which includes a highly-integrated memory and multiple processing elements formed on a single chip and is suitable for data processing.

Semiconductor devices which include a processor and memory mounted on a circuit board and are used as a specialized processing system for implementing high-speed processing, such as image processing, of a vast amount of data are known in the prior art. This prior art, in which the processor and memory are connected through buses, necessitates the operation of bus arbitration. Thus, when a series of read, compute and write operations is repeated for a vast amount of data, a significant amount of time is expended for the read and write operations and their switching operation, and data processing is inefficient.

An improved semiconductor device which includes multiple processing elements and a memory cell array mounted on a single chip, and operates to read out data of memory cells on a word line of the memory cell array and compute the data in parallel has been known in the prior art. A semiconductor device of this type is described for example in the publication: Y. Aimoto, et al. "Memory Array Circuits of Integrated Memory Array Processor (IMAP) LSI", Proceeding of the 1994 IEICE Spring Conference, 5-261 C-693.

This prior art device includes 64 processing elements and SRAMs of 2 Mb integrated on a chip, and is designed to operate the processing elements in parallel in response to an instruction based on the SIMD (Single Instruction Stream Multiple Data Stream) scheme. Although the computation of image data processing is not very intricate, the same computation is repeated a great number of times for a vast amount of data.

When the above-mentioned semiconductor device having multiple processing elements and a memory cell array is used for image data processing, the operations of reading out data from memory cells, implementing certain computation for the data with the SIMD-based processing circuit and writing data of computation result to memory cells are repeated. The series of read, compute and write operations of data takes an amount of time which is the sum of the read time tr, computation time tc and write time tw, and an m-time repetition of this series of operations takes a total time of m(tr+tc+tw).

The computation time tc may be reduced in the future when the processing circuit is further sped up based on more advanced scaling achieved by the progress of semiconductor fabricating technology.

However, the above-mentioned prior art semiconductor device having multiple processing elements and a memory cell array integrated on a chip will encounter the difficulty of increasing the volume of signals from memory cells contrary to the enhanced scaling of the memory cell array as opposed to the speeding up of processing circuit. Therefore, the data read time tr and write time tw will not be reduced significantly. Accordingly, the speed of repetitive image data processing, in which data are read out of memory cells, data are computed and data of computation result are written back to the same memory cells, will be unfavorably dominated by the data read time tr and write time tw.

SUMMARY OF THE INVENTION

Accordingly, the present invention is intended to overcome the deficiency in the prior art, and its prime object is to provide a semiconductor device which is capable of speeding up the data processing including repetitive computations such as image data processing and also reducing power consumption.

Another object of the present invention is to provide a versatile semiconductor device which can be used not only as an image data processor, but also as a usual memory for the main memory of a system, or partly for an image data processor and partly for a usual memory.

In order to achieve the above objectives, the present invention resides in a semiconductor device integrated on a chip, the device including a memory cell array having a plurality of memory cells located at intersections of data lines and word lines, a decoder which selects at least one of the word lines for reading out data from memory cells of the memory cell array onto data lines that intersect the selected word line, at least one processing element, a data transfer circuit which transfers data between the processing element and the memory cell array, and a control circuit which controls at least the data transfer circuit, decoder and processing element, wherein the data transfer circuit has read paths and write paths that operate independently of each other so that a write operation to a part of the data lines that intersect the selected word line and a read operation from another part can take place at least partially concurrently.

According to the inventive semiconductor device, the data transfer circuit is capable of concurrently transferring data read out of the memory cell array to the processing element and output data of the processing element to the memory cell array by having separate read paths and write paths between the memory cell array and the processing element. Based on the independent read paths and write paths, it is possible for the device to carry out the read operation and write operation partially concurrently by selecting different data lines between the memory cell array and processing element. Accordingly, in repetitive operations of reading out data from memory cells, computing the data and storing data of computation result in the memory cells, data can be read out and written concurrently through read paths and write paths. Consequently, the time expended for an m-time repetition of a series of operations can be reduced from the conventional m(tr+tc+tw) to tr+m×tc+tw for example by implementing the data reading and writing within the computation time tc.

In this semiconductor device, the data transfer circuit can include data reading means which selects a certain number of data lines among all data lines and reads data out of memory cells to the processing element over the selected data lines, and data writing means which selects independently of the data reading means a certain number of data lines among all data lines and writes output data of the processing element to memory cells over the selected data lines.

The data reading means is formed of switching means located between the read paths and data lines and controlled by the signals from the control circuit, and the data writing means can be formed of switching means located between the write paths and data lines and controlled by the signals from the control circuit. The switching means located between the read paths and data lines operate in response to the signals from the control circuit to connect the read paths to the data lines so that readout data on the selected data lines are delivered to the processing element. The switching means located between the write paths and data lines operate in response to the signals from the control circuit to write the computation result of the processing element to the memory cells over the selected data lines.

The data transfer circuit is preferably formed of data line blocks each including a certain number of data lines divided from all data lines, a read path or a pair of read paths and a write path or a pair of write paths provided for each block, and switch means each provided between a data line of each block and the read path and write path of the block and controlled by the control circuit to connect the data line to the read path, or connect the data line to the write path, or have an open state. This arrangement enables the connection of a data line of a block to a read path so that data is read out of a memory cell and, at the same time, the connection of a data line of the same block to a write path so that the computation result of the processing element is written to a memory cell.

Alternatively, the data transfer circuit has its blocks each further divided into small blocks each including data lines smaller in number than the number of data lines of a block, and comprises switch means each controlled by the control circuit to connect a data line of each small block to the read path lead line of the small block, or connect the data line to the write path lead line of the small block, or have an open state, switch means each provided between the read path lead line of each small block and the read path of the block and controlled by the control circuit to connect the read path lead line to the read path or have an open state, and switch means each provided between the write path lead line of each small block and the write path of the block and controlled by the control circuit to connect the write path lead line to the write path or have an open state. This arrangement enables the hierarchical selection of read paths and write paths and reduces the number of signal lines needed to control the switching means.

Any of the foregoing arrangements of the inventive semiconductor device can include means of making direct access to data stored in the memory cell array from the outside. In this case, the semiconductor device can be used as a usual memory as well as for a specialized image processor. Furthermore, the 1-chip semiconductor device can be adapted to multiple applications by allotting a certain number of memory cells of the memory cell array to a specialized computation circuit for image processing and remaining memory cells to a usual memory.

The present invention further resides in a semiconductor device comprising word lines, first and second data lines which intersect the word lines, first and second memory cells located at the intersections of the word lines and the first and second data lines, a processing element, read paths connected to input terminals of the processing element, write paths connected to output terminals of the processing element, first switching means which connect the first data lines to the read paths on write paths, and second switching means which connect the second data lines to the read paths or write paths, the first switching means and second switching means connecting the first data lines to the read paths and the second data lines to the write paths, respectively, during the active periods of word lines.

These and other objects of the present invention will become apparent from the following detailed description taken in conjunction with the accompanying drawings. Throughout the drawings, the same reference symbols are used to designate identical or similar portions.

DESCRIPTION OF THE PREFERRED EMBODIMENTS

The embodiments of the present invention will be explained in detail with reference to the drawings.

Embodiment 1

Figure 1:
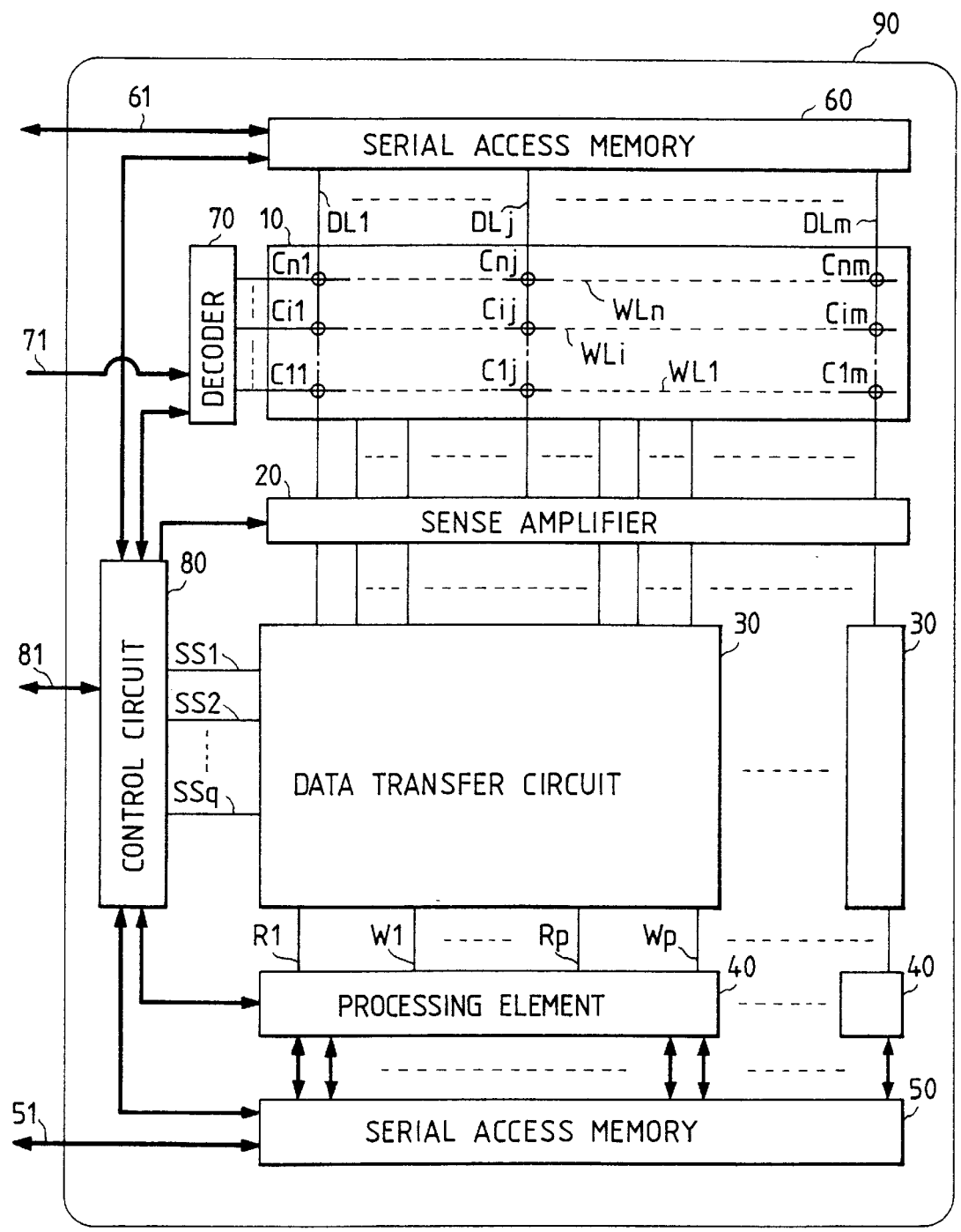
FIG. 1 is a block diagram showing the basic arrangement of the semiconductor device based on a first embodiment of this invention.

In FIG. 1 showing the basic circuit arrangement of the semiconductor device of the first embodiment, reference numeral 10 denotes a memory cell array of DRAM, which consists of memory cells of n×m in number located at intersections of word lines of n in number WLi (i=1 to n) and data lines of m in number DLj (j=1 to m). The word lines WLi are connected to a decoder 70 which designates memory cells Cij to be activated. The decoder 70 is also connected with an address input port 71 for receiving external address signals. The data lines DLj each have one end connected to a serial access memory 60 which transacts data with external devices through an I/O port 61. The data lines DLj each have another end grouped into blocks and connected through a sense amplifier 20, which amplifies and holds the signals read out of the memory cell array 10, to multiple data transfer circuits 30 in correspondence to the blocks. The data transfer circuits 30 are connected with corresponding processing elements 40 to transfer data read out of the memory cell array 10 to the processing elements 40. The processing elements 40 are connected with a serial access memory 50 which transacts data with external devices through an I/O port 51. A control-circuit 80 which controls the overall semiconductor device is connected with the above-mentioned circuits 20, 30, 40, 50, 60 and 70, and it transacts control signals with external devices through an I/O port 81. These circuits and I/O ports are integrated on a silicon chip 90.

The operation of the semiconductor device arranged as described above will be explained.

This semiconductor device on the chip 90 is designed to carry out data processing with the processing elements 40 for external data entered through the I/O port 51 and serial access memory 50 and data stored in the memory cell array 10. The control circuit 80, which receives external commands through the I/O port 81 and a clock signal, controls the operation of the decoder 70, sense amplifier 20, data transfer circuits 30, processing elements 40, and serial access memories 50 and 60 in synchronism with the clock signal. The decoder 70 receives a command from the control circuit 80 and an address from the I/O port 71 or control circuit 80, and selects the addressed word line WLi to activate a row of memory cells $C_{i1}, C_{i2}, C_{i3}, \ldots, C_{im}$ on row i of the memory cell array 10. The activated memory cells have their contents led out by the data lines DL1–DLm to the sense amplifier 20, by which the signals are amplified and held. The data transfer circuits 30 transfer the contents of the memory cells $C_{i1}, C_{i2}, C_{i3}, \ldots, C_{im}$ to the respective processing elements 40 in accordance with the signals on signal lines SS1, SS2, SS3, . . . , SSq from the control circuit 80.

Figure 2:
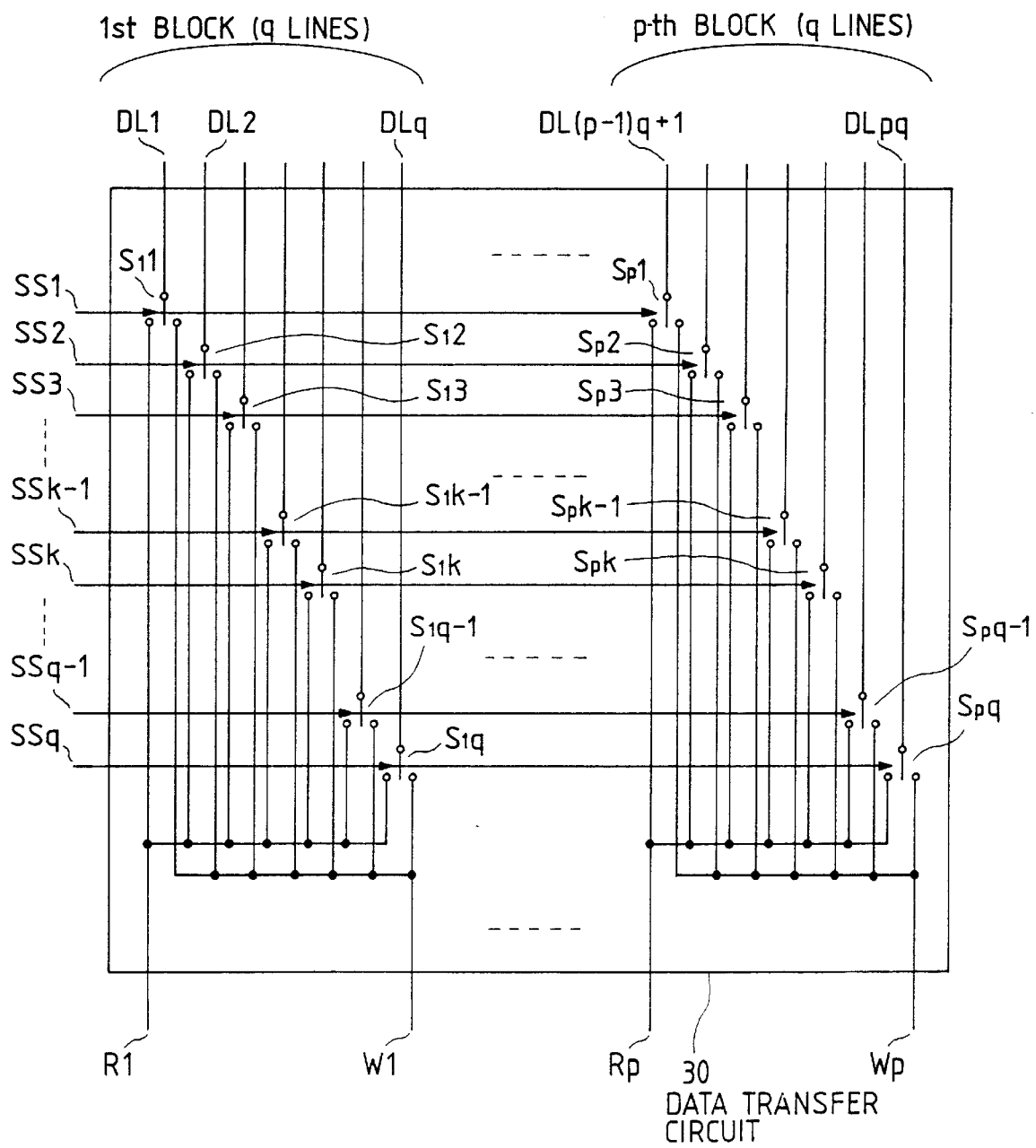
FIG. 2 is a schematic diagram showing the arrangement of the data transfer circuit shown in FIG. 1.

FIG. 2 shows in detail the arrangement of each data transfer circuit 30 shown in FIG. 1. The data transfer circuit 30 consists of p blocks, each including data lines of q in number, a read path and a write path. Each block can connect one of the q data lines to the read path and one of the q data lines to the write path.

When a word line WLi is driven and the contents of memory cells $C_{i1}-C_{im}$ are led out by the data lines DL1–DLm and amplified and held by the sense amplifier 20, the readout data appear on the data lines DL1–DLm that are connected to the data transfer circuits 30. The data transfer circuit 30 shown in FIG. 2 has the connection of data lines of p×q in number, and accordingly data appear on data lines DL1–DLpq.

For example, the control circuit 80 issues a signal on the signal line SS1 so that the switches $S_11, S_21, S_31, \ldots, S_p1$ of the first through p-th blocks turn to the read paths R1, R2, R3, . . . , Rp. Consequently, data on the data lines DL1, DLq+1, DL2q+1, . . . , DL(p−1)q+1 are transferred over the read paths R1, R2, R3, . . . , Rp to the processing element 40. The processing element 40 implements the prescribed computation for the data provided by the data transfer circuit 30 and the external data received by the I/O port 51 and held by the serial access memory 50, and places data of computation result on the write paths W1, W2, W3, . . . , Wp.

In the case of writing the computed data back to the memory cells that have been read out, the control circuit 80 issues a signal on the signal line SS1 on expiration of the computation time so that the switches $S_11, S_21, S_31, \ldots, Sp1$ turn to the write paths W1, W2, W3, . . . , Wp. Consequently, the processing element 40 writes data of computation result to the memory cells $C_{i1}, C_{i(q+1)}, C_{i(2q+1)}, \ldots, C_{i((p-1)q+1)}$ by way of the data transfer circuit 30.

Each of the switches $S_11, S_21, S_31, \ldots, S_p1$ takes one of the position of read path, position of write path and position of open state, and it is normally in the open state. Instead of the issuance of signals on the signal lines SS1–SSq by the control circuit 80 on expiration of the computation time, a signal indicative of the end of computation may be sent to the control circuit 80 so that it can control the signal lines SS1–SSq easily based on a simpler circuit arrangement. In this case, the control circuit 80 can cope with the algorithmic alteration of the processing elements 40 without the need of another estimation of computation time and a circuit modification.

Instead of writing data of computation result back to the memory cells that have been read out, the data can readily be written to other memory cells by placing signals on the signal lines SS1–SSq to select switches of relevant data lines, or the same data can be written to multiple memory cells by placing signals on the signal lines SS1–SSq to select a write path.

Accordingly, the semiconductor device of this embodiment is capable of reading out data from memory cells by using read paths during the write operation of the processing elements for data to other memory cells through write paths. For example, the control circuit 80 issues a signal on the signal line SS1 to operate on the data transfer circuits 30 to turn the switches $S_11, S_21, S_31, \ldots, S_p1$ to the write paths W1, W2, W3, . . . , Wp thereby to establish the route of writing data to memory cells $C_{i1}, C_{i(q+1)}, C_{i(2q+1)}, \ldots, C_{i((p-1)q+1)}$, and at the same time issues a signal on the signal line SS2 to operate on the data transfer circuits 30 to turn the switches $S_12, S_22, S_32, \ldots, S_p2$ to connect the data lines DL2, DLq+2, DL2q+2, . . . , DL(p−1)q+2 to the read paths R1, R2, R3, . . . , Rp. Consequently, data are read out of the memory cells $C_{i2}, C_{i(q+2)}, C_{i(2q+2)}, \ldots, C_{i((p-1)q+2)}$ and transferred to the processing elements 40. The data read and write operations are carried out cyclically, and data of memory cells $C_{i1}-C_{im}$ on row i activated by the signal on the word line WLi of the decoder 70 are processed. By driving other word lines for other rows of memory cells, all data in the memory cell array 10 can be processed successively.

Figure 3A:
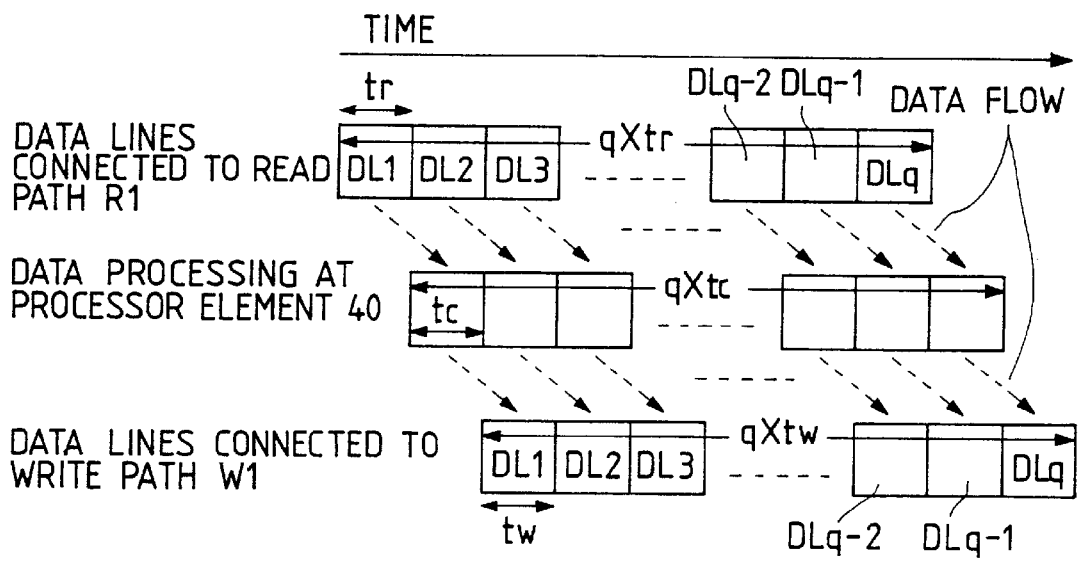
FIG. 3A is a diagram explaining, as an example, the operation of the semiconductor device of the first embodiment.

FIG. 3A shows along the time axis the treatment of data of one driven word line on the data lines connected to the read path R1 and write path W1 and in the processing element 40. Shown at the top is the time expended to read out data from the memory cells, shown at the middle is the time expended to process the data by the processing element 40, and shown at the bottom is the time expended to write the processed data to the memory cells.

More specifically, data is read out of a memory cell to the data line DL1 which is connected to the read path R1 in time length tr, the readout data is processed by the processing element 40 in time length tc, and the processed data is written back over the write path W1 and data line DL1 to the memory cell in time length tw, as shown by the arrows. From the viewpoint of parallel operation in FIG. 3A, when the data line DL3 is in connection with the read path R1, the processing element 40 is processing data, which has been transferred over the data line DL2, and the write path W1 is transferring data, which has been transferred over the data line DL1 and processed by the processing element 40, to the data line DL1. Accordingly, the read operation of data from memory cells, the computation of data and the write operation of data take place concurrently, resulting in a reduced overall data processing time.

Assuming that the computation time tc is longer than the data reading time tr and data writing time tw, it takes time tr+q×tc+tw for processing all q data placed on the data lines DL1, DL2, . . . , DLq of a block, and data processing can be sped up. Otherwise, if the data reading time tr is the longest, it takes q×tr+tc+tw, or if the data writing time tw is the longest, it takes tr+tc+q×tw. In any case, the inventive semiconductor device has the capability of faster data processing as compared with the prior art semiconductor device mentioned previously which takes time q(tr+tc+tw).

Figure 3B:
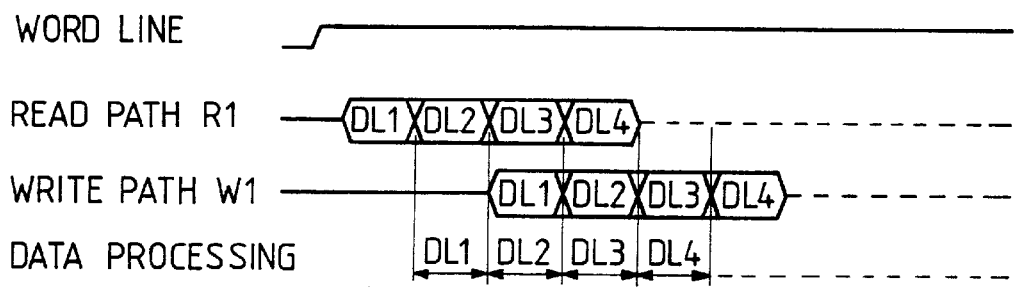
FIG. 3B is a timing chart showing, as an example, the operation of the semiconductor device of the first embodiment.
Figure 3C:
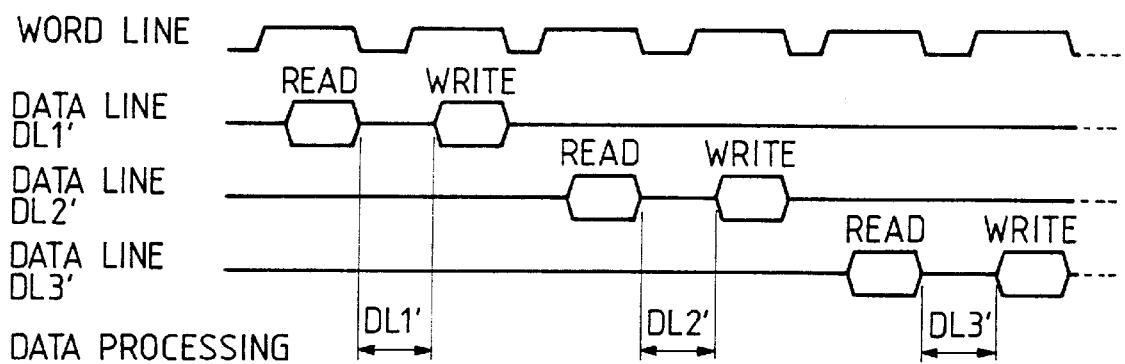
FIG. 3C is a timing chart showing, as an example, the operation of the prior art semiconductor device.

FIG. 3B shows the timing chart of the process explained above. During the active period of a word line, data are read out and written through the read path and write path, with parts of the data being treated concurrently. Specifically, data on the data line DL3 is transferred to the read path R1 of processing element and, at the same time, data of computation result on the write path W1 of processing element is transferred to the data line DL1. These concurrent data read/write operations take place in parallel to the computation by the processing element for data that has been read out to the data line DL2.

In contrast, the conventional device operates sequentially as follows. A word line is driven to read out data onto the data line DL1', the word line is deactivated, the data is processed by the processor, the word line is driven again to write the resulting data, the word line is deactivated, the word line is driven again to read out data onto the data line DL2', and so on. The operation in this manner takes place based on bus arbitration, and this is inevitable for usual processing systems in which the memory chip and processor chip are connected by buses.

Accordingly, operational advantages of the inventive semiconductor device as compared with the prior art device are the elimination of bus arbitration, the elimination of read/write switching time, and the elimination of repetitive driving of word lines. Consequently, the inventive semiconductor device has the capability of faster data processing.

Moreover, the data transfer circuit 30 having independent read and write operations can readily be operated under different timing control than that explained above to meet individual purposes. For example, data are read out consecutively onto the data lines DL1, DL2 and DL3, these data are used for computation, and data of computation result is placed on the data line DL1. This example is suitable for the filtering process of an image.

The data transfer circuit 30 is also effective for writing certain data quickly to all memory cells of the image memory for clearing the display screen. In this case, data to be written is placed on a write path and multiple data lines are connected to the write path simultaneously so that the data is written to multiple memory cells at once. More than one word line may be driven simultaneously so as to write the same data to more memory cells at once, and the screen clearing operation can be sped up.

According to the inventive data transfer circuit 30, data in memory cells can be processed successively while the cells are kept active by the once-activated word line. Consequently, the number of driving of word lines and the number of operations of the sense amplifier can be reduced, which is effective for speeding up the data processing and reducing the power consumption.

It is possible to read out data from memory cells selected by data lines DL1, DLq+1, DL2q+1, . . . , DL(p−1)q+1 in connection with the signal line SS1, for example, and at the same time write data to memory cells selected by data lines DL2, DLq+2, DL2q+2, . . . , DL(p−1)q+2 in connection with another signal line SS2. Consequently, the processing element 40 does not need to wait for the data read/write operations, and faster data processing is made possible.

In regard to the layout design of the chip 90, if there is a great difference between the pitch of data lines of the memory cell array 10 and the width of the processing element 40, it is necessary to make the data line pitch coincident with the processing element 40. According to the inventive semiconductor device, the data line pitch can be relaxed by a factor of q:2 by the presence of the data transfer circuits 30. Accordingly, by setting this ratio depending on the pitch difference, the high-density layout of the memory cell array 10 and processing elements 40 is made possible.

The inventive semiconductor device can also be used as a usual memory. In this case, the control circuit 80 receives external control signals through the I/O port 81 and a clock signal, and controls the sense amplifier 20, decoder 70 and serial access memories 50 and 60 in synchronism with the clock signal. The address signals are received on the address input port 71 and data are transacted on the I/O ports 51 and 61 through the serial access memories 50 and 60. Accordingly, the inventive semiconductor device can be used on a time-slice basis as a specialized image processor and as a usual memory for the main memory of the system, and consequently the overall system can be made compact.

The memory cell array 10 can be used by being divided into an area for the usual memory and an area specialized for the processing elements 40. For example, for the application of image processing, a memory area of a proper size can be allotted to the processing elements 40 depending on the kind of image to be processed, screen size, and display speed of each system, and the remaining memory area is used as a usual memory for the main memory of the system.

This versatile 1-chip semiconductor device enables the system designers to save the labor and time for designing chips for their systems. The memory area left unused by image processing can be used for the main memory of the system, whereby the overall system is compact. The inventive semiconductor device can be run with another processor in parallel to carry out much faster image processing.

Although the memory cell array 10 of DRAM necessitates refreshing, the refresh operation is not required if all memory cells are accessed faster than the data retention time of memory cells in displaying an image on the screen or processing image data of all memory cells sequentially. Accordingly, much faster memory access can be expected, and the refresh circuit can be eliminated so as to reduce the chip size.

Figure 6:
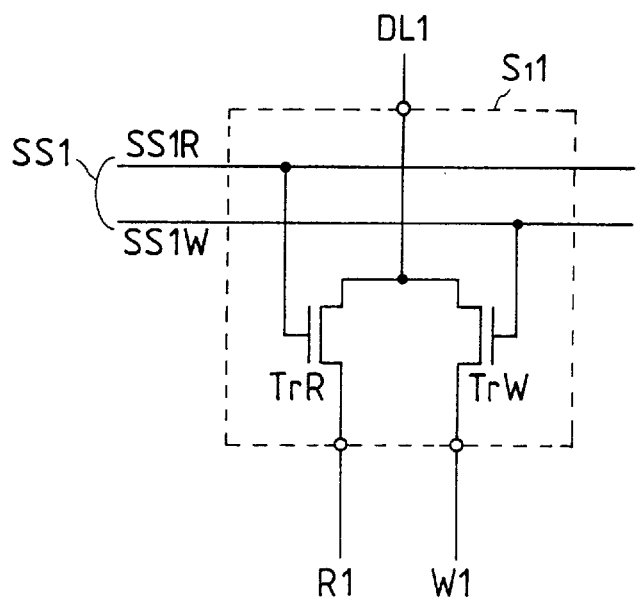
FIG. 6 is a schematic diagram showing a specific arrangement of the switch useful for the data transfer circuit of the inventive semiconductor device.

FIG. 6 shows the structure of the switch $S_1 1$ among the switches $S_j k$ (j=1 to p, k=1 to q) used in the data transfer circuit 30. The switch $S_1 1$ of this example consists of two MOS transistors TrR and TrW, and has two control signal lines SS1R and SS1W for controlling the connection to the read path and write path. The signal line SS1R turns on the MOS transistor TrR to connect the data line DL1 to the read path R1, and the signal line SS1W turns on the MOS transistor TrW to connect the data line DL1 to the write path W1.

Figure 7:
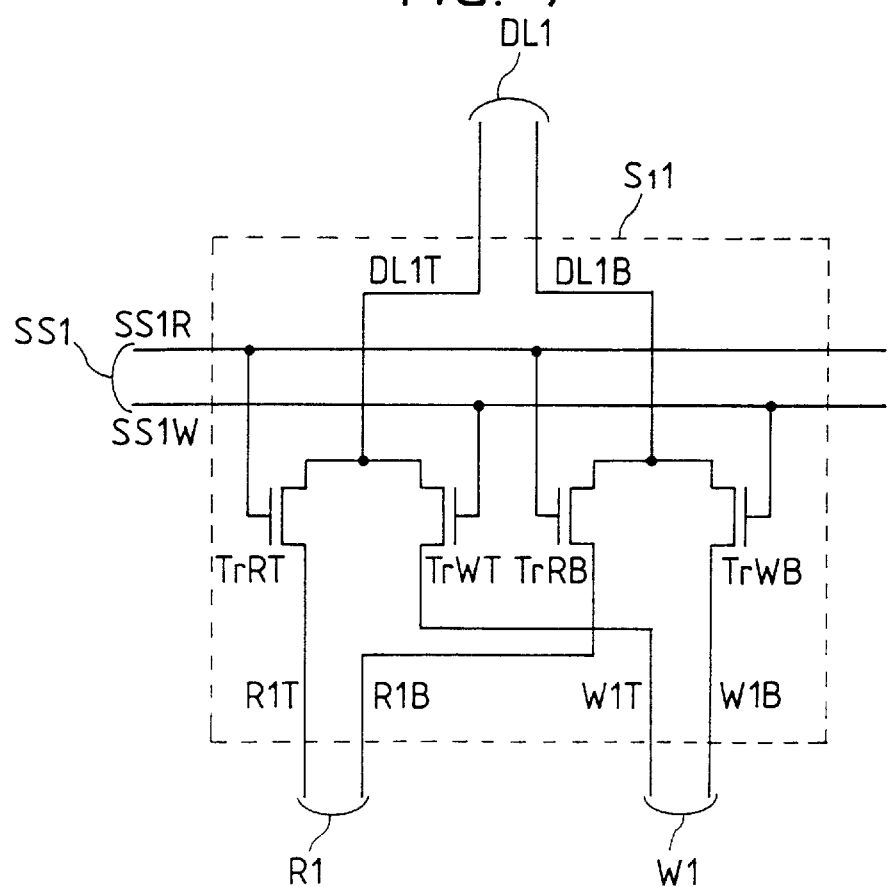
FIG. 7 is a schematic diagram showing another arrangement of the switch useful for the data transfer circuit of the inventive semiconductor device.

FIG. 7 shows another example of the structure of the switch $S_1 1$ among the switches $S_j k$ (j=1 to p, k=1 to q) used in the data transfer circuit 30, which are intended to transfer pairs of signals received from differential amplifiers as the sense amplifier 20 over data line pairs DL1T and DL1B, DL2T and DL2B, . . . , DLqT and DLqB, in place of the data lines DL1, DL2, . . . , DLq. The switch $S_1 1$ consists of four MOS transistors TrRT, TrWT, TrRB and TrWB, and has a pair of read paths R1T and R1B and a pair of write paths W1T and W1B in correspondence to the data line pair DL1T and DL1B, in place of the read path R1 and write path W1. The signal line SS1R turns on the MOS transistors TrRT and TrRB to connect the data line pair DL1T and DL1B to the read path pair R1T and R1B, and the signal line SS1W turns on the MOS transistors TrWT and TrWB to connect the data line pair DL1T and DL1B to the write path pair W1T and W1B.

Figure 8:
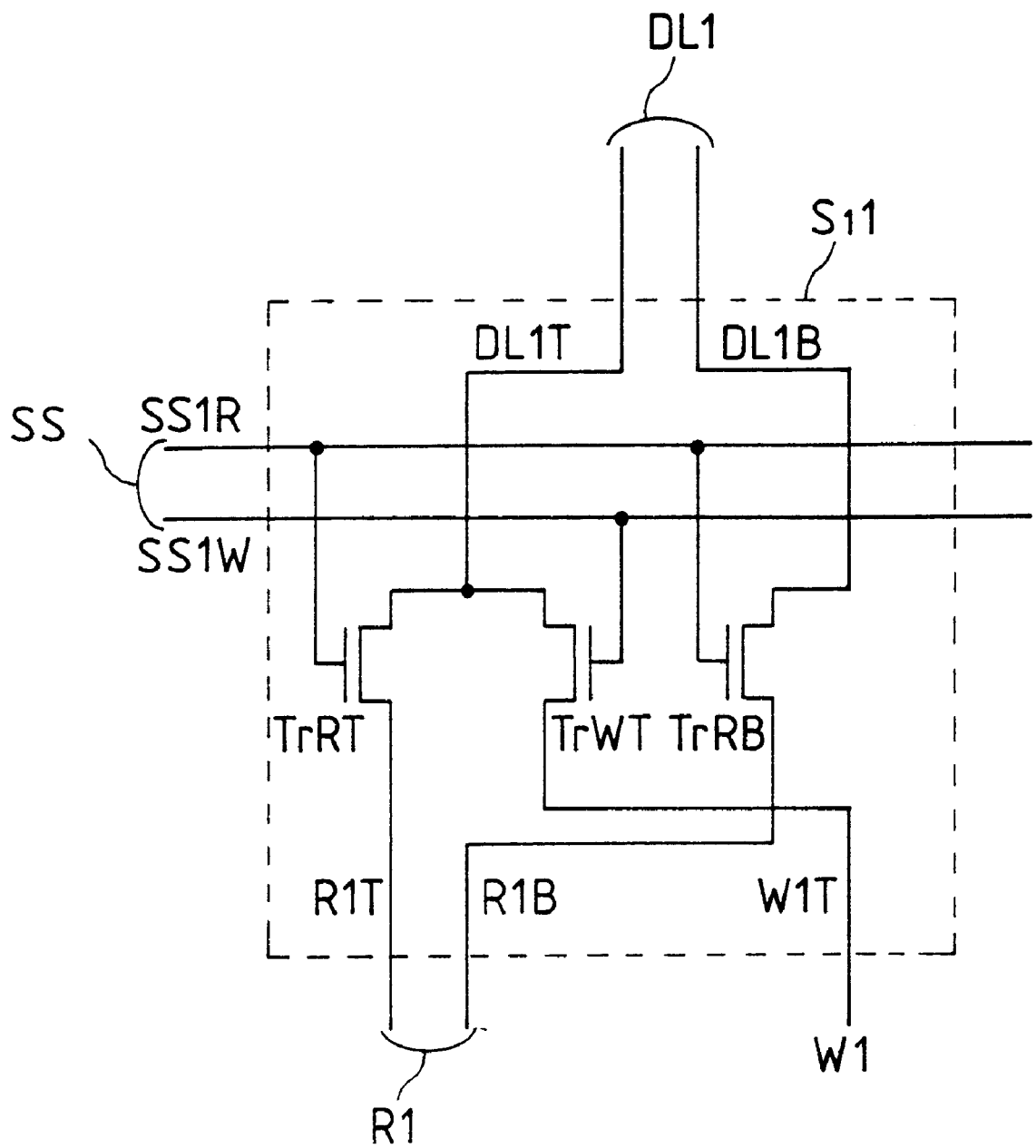
FIG. 8 is a schematic diagram showing still another arrangement of the switch useful for the data transfer circuit of the inventive semiconductor device.

FIG. 8 shows still another example of the switch $S_1 1$, which is intended to connect a pair of data lines to a pair of read paths and connect one data line to one write path. This arrangement is useful when the pitch of data line pairs is too small to lay out the wiring of transistors of the switch shown in FIG. 7. Alternatively, the switch $S_1 1$ can have one read path and a pair of write paths obviously.

Although the examples of the switches Sjk (j=1 to p, k=1 to q) shown in FIGS. 6, 7 and 8 employ n-MOS transistors, they can be replaced with p-MOS transistors or CMOS transistors depending on individual purposes obviously.

Embodiment 2

Figure 4:
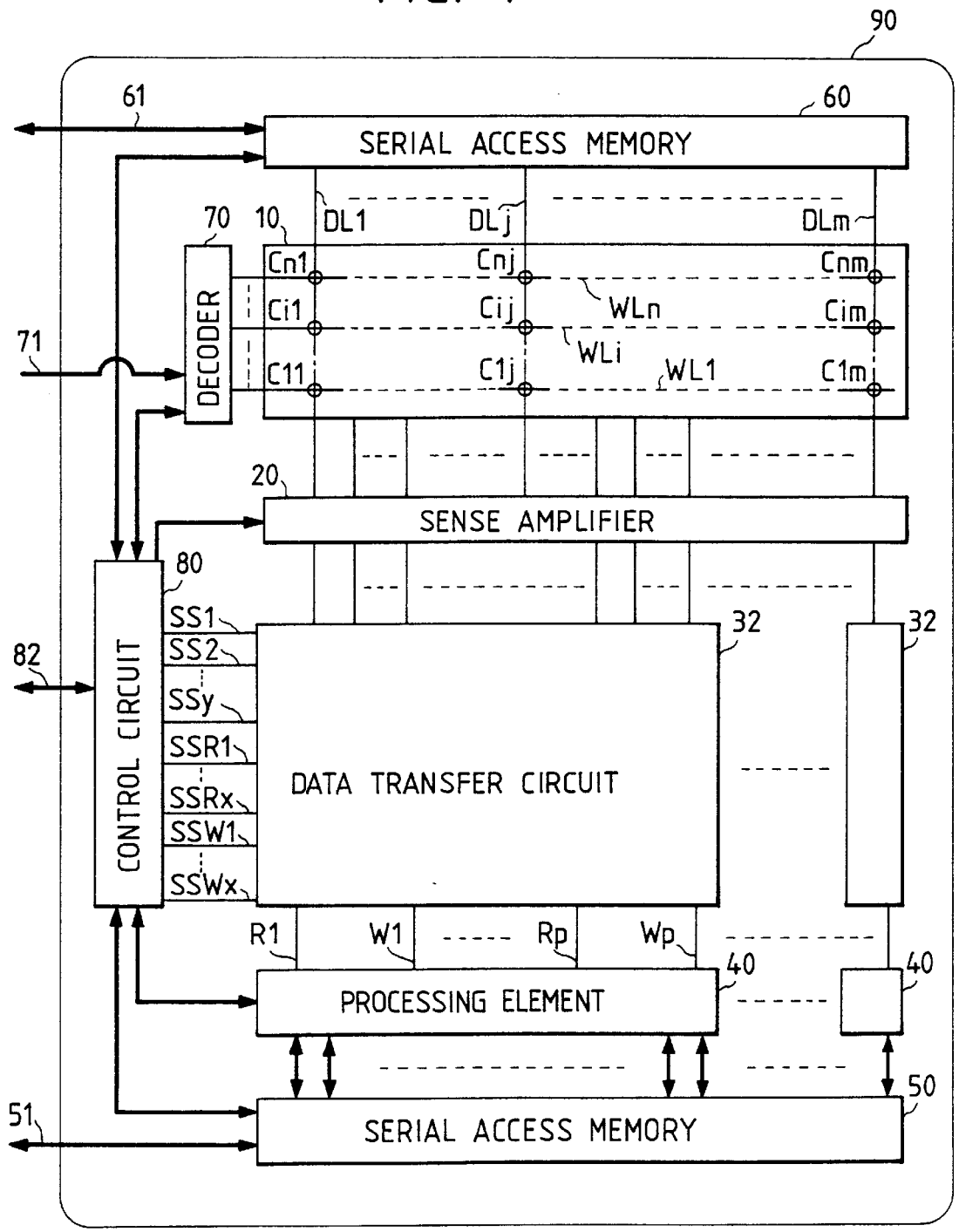
FIG. 4 is a block diagram showing the basic arrangement of the semiconductor device based on a second embodiment of this invention.

FIG. 4 shows the basic circuit arrangement of the semiconductor device based on the second embodiment of this invention. In the figure, portions identical to those of the first embodiment shown in FIG. 1 are referred to by the same reference symbols, and detailed explanation thereof will be omitted. This embodiment differs from the first embodiment in the arrangement of the data transfer circuit and the addition of signal lines SSR1–SSRp of p in number and signal lines SSW1–SSWp of p in number from the control circuit with the intention of the hierarchical switching operation of the read paths and write paths.

Figure 5:
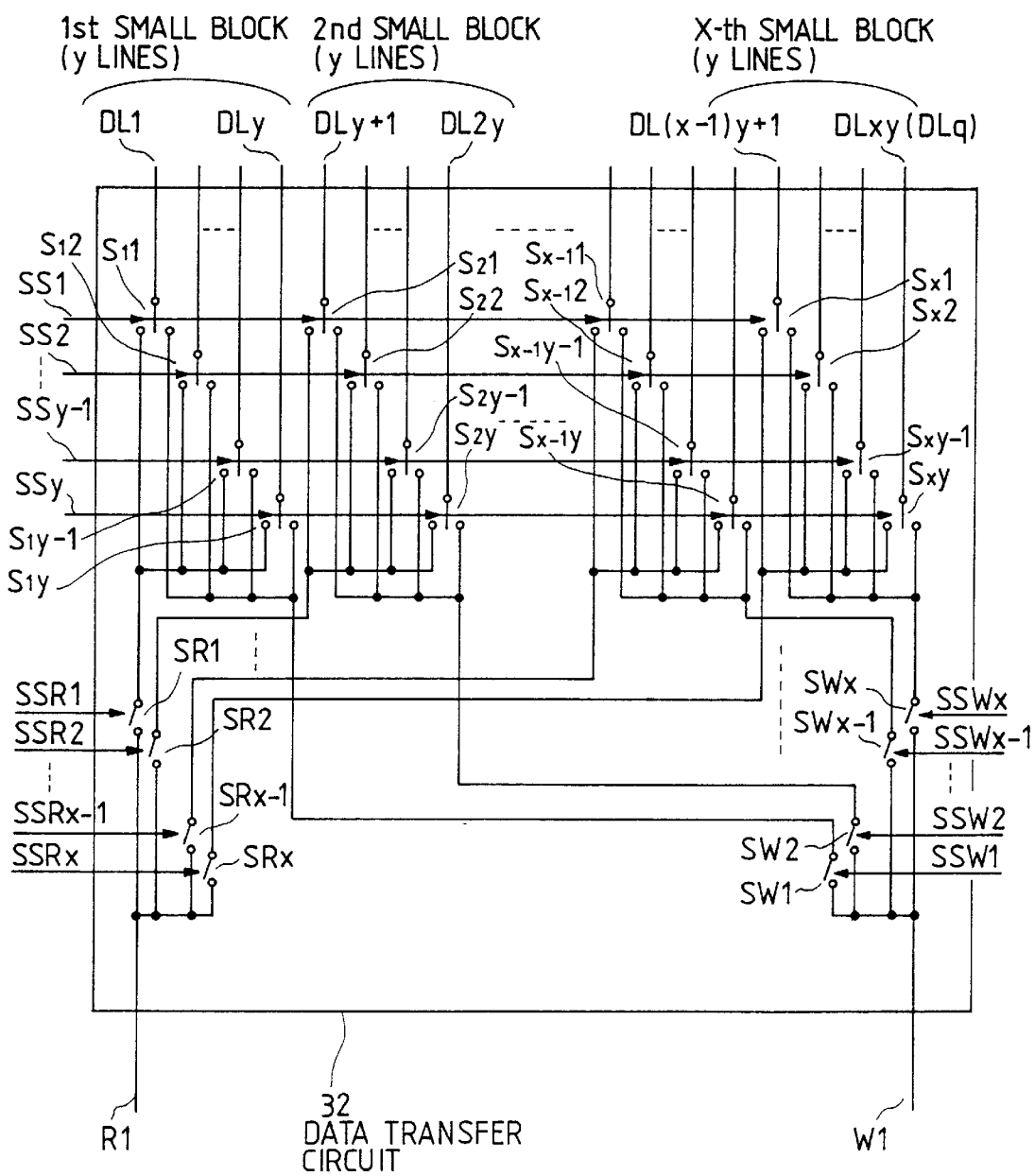
FIG. 5 is a schematic diagram showing the arrangement of the data transfer circuit shown in FIG. 4.

FIG. 5 shows in detail the arrangement of part of a block (first block as shown in FIG. 2) of one of the data transfer circuits 32 shown in FIG. 4. The data transfer circuit 32 has its first block with q data lines divided into small blocks of x in number, with each small block having data lines of y in number. The data lines of each small block, e.g., first block, are connected to the read path R1 by switches SR1–SRx and connected to the write path W1 by switches SW1–SWx. These switch pairs provided in correspondence to the small blocks have open or closed states in response to the signals on signal lines SSR1–SSRx and SSW1–SSWx from the control circuit 82. The signals on the signal lines SS1–SSy from the control circuit 82 operate on the switches $S_1 1-S_x y$ of q (q=xy) in number to connect data lines selected from among q data lines of all small blocks to the read path lead lines or write path lead lines of the switches. The selected data lines that are now in connection with the lead lines are further connected by the switches SR1–SRx and SW1–SWx in response to the signals on the signal lines SSR1–SSRx and SSW1–SSWx to the read path R1 and write path W1.

Although the control circuit 82 of this embodiment needs to control the additional signal lines SSR1–SSRx and SSW1–SSWx of 2x in number for the hierarchical switching of the read paths and write paths, it has the following advantages.

In the data transfer circuit 32 shown in FIG. 5, the number of data lines connected to a read path or write path can be smaller than q that is the case of the data transfer circuit 30 shown in FIG. 2. An increased number of data lines require more signal lines SS1–SSq, resulting in an increased load capacitance emerging on the read paths and write paths and eventually in a degraded operational speed. In regard to this situation, switches out of SR1–SRx and SW1–SWx for small blocks that need not be connected to the read path and write path are made open by the hierarchical control of the control circuit 82, and an increased number of data lines can be connected to each read path and write path without having an increased load capacitance, whereby the data read operation and write operation can be sped up.

The basis of the smaller load capacitance on the read/write paths of the hierarchical data transfer circuit 32 as compared with the data transfer circuit 30 of FIG. 2 will be explained in brief for the case where each of the switches $S_1 1-S_x y$ and $S_1 1-S_p q$ is formed of two MOS transistors and each of the switches SR1–SRx and SW1–SWx is formed of one MOS transistor.

The load capacitance created by the connection of the data line DL1 to the read path R1 is estimated for both of the data transfer circuits 30 and 32 as follows.

With each MOS transistor having a source-to-drain capacitance plus gate parasitic capacitance of Cd, the load capacitance on the read path R1 of the data transfer circuit 30 of FIG. 2 when the switch $S_1 1$ is open is Cd×q. When the switch $S_1 1$ is closed, another Cd is added, and the total capacitance $C_{FIG2}$ becomes Cd×(q+1). Whereas, the load capacitance on the read path R1 of the data transfer circuit 32 of FIG. 5 is Cd×x. When the switches $S_1 1$ and SR1 are closed, another Cd and Cd×(y+1) are added, and the total capacitance $C_{FIG5}$ becomes Cd×(x+y+2).

The condition for the ratio of $C_{FIG2}$ to $C_{FIG5}$, i.e., $K=C_{FIG2}/C_{FIG5}$, to be smaller than one, and for $C_{FIG5}$ to be greater than $C_{FIG2}$ are expressed as follows.

$$(x \times y+1)/(x+y+2)<1$$

$$(x \times y+1)-(x+y+2)<0$$

These relations give:

$$(x-1) \times (y-1)<2 \qquad (1)$$

Specifically, the capacitance $C_{FIG5}$ is greater than $C_{FIG2}$ only when x=2 and y=3, or x=3 and y=2. In other words, the load capacitance $C_{FIG5}$ of the data transfer circuit 32 is the smaller when the values of x and y are both greater than 3. The greater the values of x and y, the greater is the value of K. Accordingly, the data transfer circuit 32 has a smaller load capacitance as compared with the data transfer circuit 30.

In the data transfer circuit 32 of this embodiment, each block of q data lines in the data transfer circuit 30 of FIG. 2 is further divided into y small blocks each including x data lines. The switches of the data transfer circuit 30 have x×y (i.e., q) signal lines from the control circuit 80, whereas the switches of the data transfer circuit 32 have y+2x signal lines from the control circuit 82. Accordingly, the data transfer circuit 32 of this embodiment does not much increase the number of control signal lines when the number of data lines is increased, and it is advantageous to accomplish a smaller chip area. It also provides an enhanced latitude of design based on the wide choice of the number of data lines connected to each read path and write path. In case each of the switches $S_1 1-S_x y$ and $S_1 1-S_p q$ is formed of two MOS transistors, the numbers of signal lines SS1–SSy and SS1–SSq from the control circuits 82 and 80, respectively, are doubled.

The semiconductor device of this embodiment can be used as a usual memory, or can be used on a time-slice basis as a specialized image processor and as a usual memory for the main memory of the system, as in the case of the first embodiment. The memory cell array can be divided into an area for the usual memory and an area specialized for the processing elements, as in the first embodiment.

The switches $S_1 1-S_x y$ of the data transfer circuit 32 shown in FIG. 5 can have any of the circuit arrangements of MOS transistors shown in FIG. 6, FIG. 7 and FIG. 8 depending on individual purposes.

As described above, the semiconductor device based on the present invention is designed to provide the data transfer circuits located between the memory cell array and processing elements with data read paths from memory cells and data write paths to memory cells so that the data read operation and write operation can take place concurrently. Consequently, the overall data processing time can be reduced from the conventional m(tr+tc+tw) to m×tr+tc+tw or tr+m×tc+tw or tr+tc+m×tw, and data processing can be sped up significantly. It is also possible to process data of memory cells on once-activated data lines successively thereby to reduce the number of times of driving of each word line, and the power consumption can be reduced.

While particular embodiments of the present invention have been described, the invention is not confined to these embodiments, but changes and modifications can be made without departing from the invention in its broader aspects.

What is claimed is:

1. A semiconductor circuit formed on a single chip comprising:
    a memory array including a plurality of memory cells provided at crosspoints of a plurality of data lines and a plurality of word lines;
    a processing element, which processes data stored in said memory array, coupled to said memory array;
    a serial access memory coupled to said memory array;
    an I/O port coupled to said serial access memory; and
    wherein the data inputted from the I/O port is further transferred from the serial access memory into the processing element, without passing through the memory cell array.

2. A semiconductor circuit formed on a single chip, comprising:
    a memory cell array including a plurality of memory cells provided at crosspoints of a plurality of data lines and a plurality of word lines;
    a processing element, which processes data stored in said memory cell array;
    a serial access memory;
    an I/O port coupled to the serial access memory;
    wherein data stored in the memory cell designated by an address inputted externally is transferred to the serial access memory and is read out by being outputted from the I/O port; and
    wherein the data inputted from the I/O port is further transferred from the serial access memory into the processing element, without passing through the memory cell array.

3. A semiconductor circuit formed on a single chip, comprising:
    a memory cell array including a plurality of memory cells provided at crosspoints of a plurality of data lines and a plurality of word lines;
    a processing element, which processes data stored in said memory cell array;
    a serial access memory;
    an I/O port coupled to the serial access memory;
    wherein a data inputted from the I/O port is stored into the memory cell designated by an address inputted externally by being transferred to the serial access memory and further being transferred to the memory cell array; and
    wherein the data inputted from the I/O port is further transferred from the serial access memory into the processing element, without passing through the memory cell array.

4. A semiconductor circuit formed on a single chip, comprising:
    a memory cell array including a plurality of memory cells provided at crosspoints of a plurality of data lines and a plurality of word lines;
    a processing element, which processes data stored in said memory cell array;
    a serial access memory;
    an I/O port coupled to the serial access memory;
    wherein data inputted from the I/O port is held in the serial access memory and further transferred to the processing element; and
    wherein the data inputted from the I/O port is further transferred from the serial access memory into the processing element, without passing through the memory cell array.

5. A semiconductor circuit formed on a single chip comprising:
    a memory array including a plurality of memory cells provided at crosspoints of a plurality of data lines and a plurality of word lines;
    a processing element, which processes data stored in said memory array, coupled to said memory array;
    a serial access memory coupled to said memory array;
    an I/O port coupled to said serial access memory; and
    wherein the processing element calculates by using the data held in the serial access memory inputted from the I/O port, and the data stored in the memory cell array.

6. A semiconductor circuit formed on a single chip, comprising:
    a memory cell array including a plurality of memory cells provided at crosspoints of a plurality of data lines and a plurality of word lines;
    a processing element, which processes data stored in said memory cell array;
    a serial access memory;
    an I/O port coupled to the serial access memory;
    wherein data stored in the memory cell designated by an address inputted externally is transferred to the serial access memory and is read out by being outputted from the I/O port; and
    wherein the processing element calculates by using the data held in the serial access memory inputted from the I/O port, and the data stored in the memory cell array.

* * * * *